(12) United States Patent
Lindgren

(10) Patent No.: US 8,569,161 B2
(45) Date of Patent: Oct. 29, 2013

(54) SEMICONDUCTOR DEVICE WITH COPPER WIREBOND SITES AND METHODS OF MAKING SAME

(75) Inventor: Joseph T. Lindgren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/103,459

(22) Filed: May 9, 2011

(65) Prior Publication Data

US 2011/0212578 A1 Sep. 1, 2011

Related U.S. Application Data

(62) Division of application No. 11/862,744, filed on Sep. 27, 2007, now Pat. No. 7,939,949.

(51) Int. Cl.
*H01L 21/44* (2006.01)

(52) U.S. Cl.
USPC ............ 438/612; 257/E21.506; 257/E21.539; 257/E21.59

(58) Field of Classification Search
USPC ................ 438/612, 680; 257/753, 781, 784, 257/E23.02, E23.023, E21.506, E21.509, 257/E21.59
See application file for complete search history.

(56) References Cited

U.S. PATENT DOCUMENTS

| | | |
|---|---|---|
| 5,665,996 A | 9/1997 | Williams et al. |
| 5,736,456 A | 4/1998 | Akram |
| 6,180,505 B1 * | 1/2001 | Uzoh ............................ 438/614 |
| 6,413,864 B1 * | 7/2002 | Pyo ................................ 438/687 |
| 6,451,681 B1 | 9/2002 | Greer |
| 6,455,408 B1 | 9/2002 | Hwang et al. |
| 6,620,720 B1 | 9/2003 | Moyer et al. |
| 7,282,433 B2 | 10/2007 | Tang et al. |
| 2002/0084516 A1 * | 7/2002 | Efland et al. ................... 257/666 |
| 2002/0111010 A1 * | 8/2002 | Walker et al. ................. 438/614 |
| 2005/0062170 A1 * | 3/2005 | Biggs et al. .................... 257/780 |
| 2005/0208751 A1 * | 9/2005 | Oh et al. ........................ 438/614 |

FOREIGN PATENT DOCUMENTS

WO 2005062367 A1 7/2005

* cited by examiner

*Primary Examiner* — Benjamin Sandvik
*Assistant Examiner* — Leslie Pilar Cruz
(74) *Attorney, Agent, or Firm* — Perkins Coie LLP

(57) ABSTRACT

Semiconductor devices with external wirebond sites that include copper and methods for fabricating such semiconductor devices are disclosed. One embodiment of a method for fabricating a semiconductor device comprises forming a dielectric layer on an active side of a semiconductor substrate. The dielectric layer has openings aligned with corresponding wirebond sites at the active side of the substrate. The method further includes forming a plurality of wirebond sites located at the openings in the dielectric layer. The wirebond sites are electrically coupled to an integrated circuit in the semiconductor substrate and electrically isolated from each other. Individual wirebond sites are formed by electrolessly depositing nickel into the openings and forming a wirebond film on the nickel without forming a seam between the nickel and the dielectric layer.

17 Claims, 7 Drawing Sheets

SEMICONDUCTOR DEVICE WITH COPPER WIREBOND SITES AND METHODS OF MAKING SAME

CROSS-REFERENCE TO RELATED APPLICATION

This application is a divisional of U.S. application Ser. No. 11/862,744 filed Sep. 27, 2007, now U.S. Pat. No. 7,939,949, which is incorporated herein by reference in its entirety.

TECHNICAL FIELD

The present invention relates to semiconductor devices and methods for making semiconductor devices with external wirebond sites that include copper.

BACKGROUND

Semiconductor devices are typically manufactured on semiconductor wafers or other types of workpieces using sophisticated equipment and processes that enable reliable, high-quality manufacturing. The individual dies (e.g., devices) generally include integrated circuits and a plurality of bond-pads coupled to the integrated circuits. The bond-pads provide external contacts through which supply voltage, electrical signals, and other input/output parameters are transmitted to/from the integrated circuits. Bond-pads are usually very small, and they are typically at an active side of a die in a dense array having a fine pitch. As a result, the bond-pads are typically electrically connected to a larger array of ball-pads or pins using wirebonds and/or redistribution structures.

Conventional bond-pads are typically formed by depositing an aluminum layer onto a semiconductor substrate using physical vapor deposition (PVD) techniques. The aluminum layer is then patterned and etched to form electrically isolated bond-pads. This process is relatively expensive because patterning and etching require expensive microlithography equipment and materials. Aluminum is also being replaced by copper to increase the speed of devices and enable smaller lines because of the higher conductivity of copper. Copper lines are often made by depositing a seed layer of copper into trenches using physical vapor deposition processes, electroplating copper into the trenches, and planarizing the copper to form copper damascene lines and copper bond pads coupled to the copper damascene lines. Copper, however, does not provide a suitable surface for wirebonding, so the copper bond pads must be coated with gold, silver, palladium, aluminum, or another suitable wirebonding film to which wirebonds can be attached.

One existing method for forming copper bond-pads is to form copper terminals at the active side of the substrate and then cover the copper terminals with suitable wirebonding materials. For example, after forming copper terminals at the active side of the substrate, a passivation layer with openings aligned with corresponding copper terminals is formed over the active side of the substrate. Nickel is then electrolessly plated onto the copper terminals, and a suitable wirebonding material, such as gold, silver, palladium, or aluminum, is subsequently deposited onto the nickel. Although this process is useful, copper bond-pads formed according to this process are subject to reliability concerns, such as the passivation layer delaminating from the copper when exposed to moisture for extended periods of time. This can cause shorting or other problems with a die, and bridging is more acute as the spacing between metal lines decreases.

DETAILED DESCRIPTION

Specific details of several embodiments are described below with reference to semiconductor devices with external wirebond sites that include copper and methods for fabricating such semiconductor devices. The semiconductor components are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash-memory), processors, imagers, and other types of devices can be constructed on semiconductor wafers. Although many of the embodiments are described below with respect to semiconductor devices that have integrated circuits, other types of devices manufactured on other types of substrates may be within the scope of the invention. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the features shown and described below with reference to FIGS. 1-8.

Figure 1:
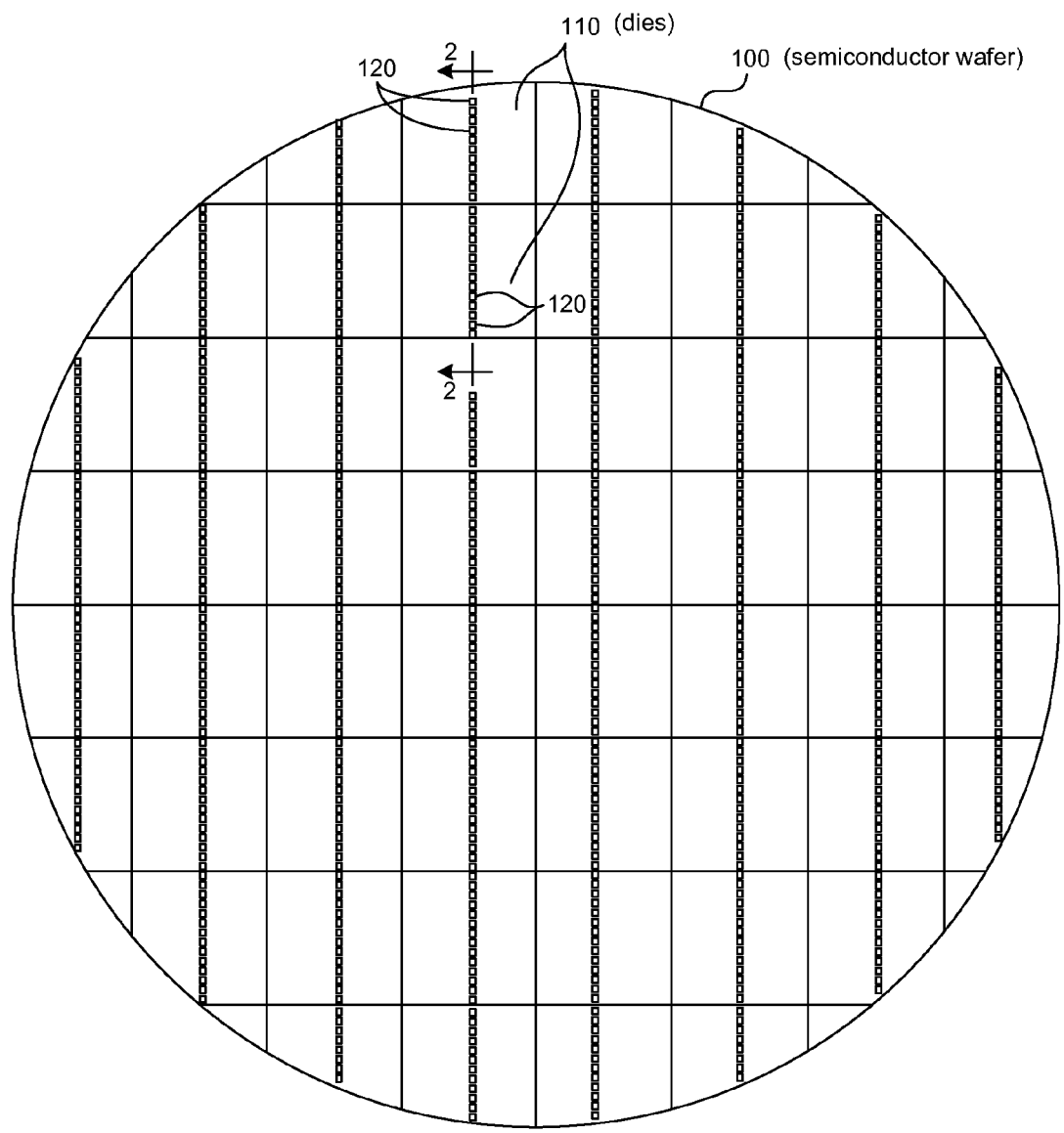
FIG. 1 is a top plan view of a semiconductor wafer having a plurality of dies with wirebond sites in accordance with an embodiment of the invention.
Figure 2:
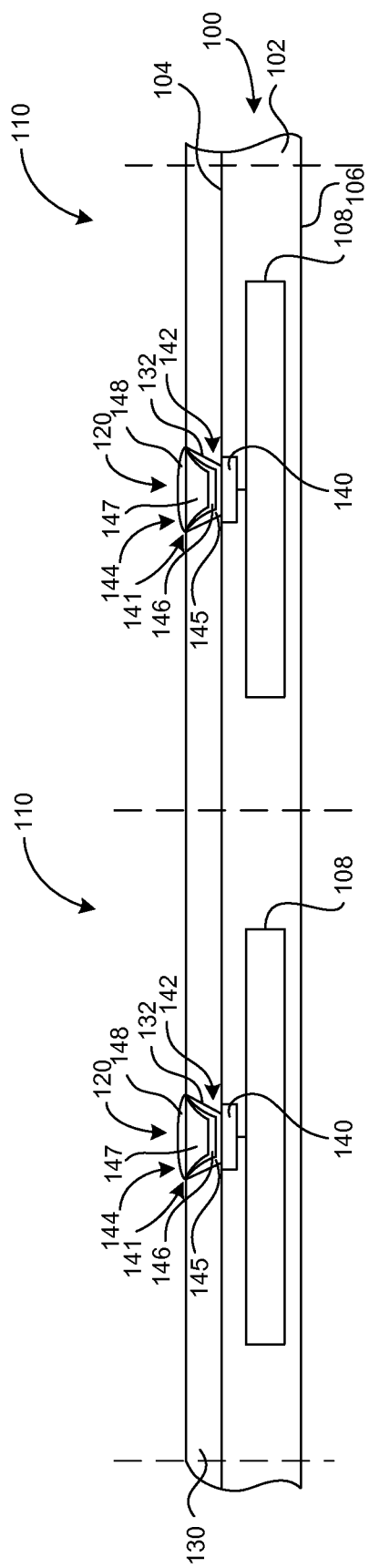
FIG. 2 is a cross-sectional view taken along line 2-2 in FIG. 1 that schematically illustrates semiconductor devices.

FIG. 1 is a top plan view of a semiconductor wafer 100 having a plurality of dies 110, and FIG. 2 is a cross-sectional view taken along line 2-2 of FIG. 1 that schematically illustrates two of the dies 110. The dies 110 include a plurality of wirebond sites 120 that are suitable for wirebonding. The wirebond sites 120 are arranged in arrays at each die and formed, at least in part, of copper. However, unlike the conventional wirebond site with copper, the structure of the wirebond sites 120 eliminates or at least mitigates associated reliability and delamination problems.

Referring to FIG. 2, the wafer 100 includes a semiconductor substrate 102 having a first side 104 and a second side 106. The first side 104 of the semiconductor substrate 102 can be an active side. The semiconductor substrate 102 can be composed of silicon, gallium arsenide, or other suitable semiconductor materials. Individual dies 110 can include one or more integrated circuits 108 formed on and/or in the semiconductor substrate 102 using known methods. The integrated circuits 108 are electrically coupled to individual arrays of wirebond sites 120. The arrays of wirebond sites 120 can be configured as illustrated in FIG. 1, or the arrays can have other configurations at the first side 104 and/or the second side 106 of the semiconductor substrate 102.

The wafer 100 can further include a dielectric layer 130 over the first side 104 of the semiconductor substrate 102. In this embodiment, the dielectric layer 130 has a plurality of openings 132, and individual openings 132 are at least partially aligned with corresponding wirebond sites 120. The dielectric layer 130 can be a polyimide or other suitable material for protecting the first side 104 of the substrate 102 and electrically isolating the wirebond sites 120 from each other. The dielectric layer 130, for example, can be a photoimageable polymer, such as a photoimageable polyimide, that can be patterned to form the openings 132 using microlithography techniques.

The wirebond sites 120 define external electrical connectors to which wirebonds or other suitable conductive elements may be attached. Individual wirebond sites 120 include a copper terminal 140 at the first side 104 of the substrate 102. The copper terminals 140 can be bases of the wirebond sites 120, and the copper terminals 140 are electrically connected to one of the integrated circuits 108 via interconnects or other conductive lines within the substrate 102. The copper terminals 140 can be formed by electrolessly plating copper or electroplating copper onto the substrate 102 before depositing the dielectric layer 130 onto the substrate 102. The wirebond sites 120 further include wirebond interfaces 141 on corresponding copper terminals 140. Individual wirebond interfaces 141 include an adhesion element 142 and a conductive wirebond element 144. The adhesion elements 142 can be conductive and include one or more layers on the copper terminals 140 and along the openings 132 of the dielectric layer 130. For example, the embodiment of the adhesion element 142 illustrated in FIG. 2 includes a liner 145 and a copper deposit 146 on the liner 145. The liner 145 can be a conductive layer formed from tantalum, tantalum nitride, titanium, titanium nitride, or another suitable material that is conductive and adheres well to the sidewalls of the openings 132. The wirebond elements 144 can include a nickel layer 147 and a wirebond film 148. The nickel layer 147 can be electrolessly deposited onto the copper deposit 146, and the wirebond film 148 can be gold, palladium, silver, aluminum, or another material suitable for attaching wirebonds to the dies 110. In some embodiments, individual adhesion elements 141 have a depression at least partially extending into the opening 132, and the nickel layer 147 has a volume in the depression greater than a volume of the wirebond film 148 in the depression.

Several embodiments of the semiconductor devices or dies 110 illustrated in FIG. 2 include copper wirebond sites that do not require an aluminum layer to be patterned and etched. The specific embodiments of the wirebond sites 120 illustrated in FIG. 2 are robust and do not suffer from the delamination problems to the same extent as the existing copper bond-pads described above in the Background section. More specifically, the present inventors discovered that the delamination, which can lead to dielectric breakdown and subsequent copper migration and bridging, was caused by the formation of a seam between the nickel layer and the sidewalls of the openings in the passivation layer. Without being bound by theory, the present inventors believe that seams form in such conventional devices because the tensile stress in the palladium or gold film deposited onto the nickel pulls the nickel away from the passivation layer. As a result, moisture can get into the seam and corrode the copper and/or delaminate the passivation layer during high temperature testing. It is this corrosion that can cause dielectric cracking and subsequent copper migration, which can cause bridging and line failures in the prior art devices, and particularly so with fine pitch bond-pad arrays. The adhesion elements 142 of the wirebond sites 120 overcome this problem. For example, the adhesion elements are formed such that the adhesion force between the adhesion elements 142 and the dielectric layer 130 is greater than the tensile stresses in the wirebond elements 144. As such, the tensile stresses in the wirebond elements 144 do not separate the adhesion elements 142 from the dielectric layer 130. The wirebond sites 120 can accordingly prevent, or at least inhibit, seams or gaps from forming between the metal and the dielectric layer.

Figure 3A:
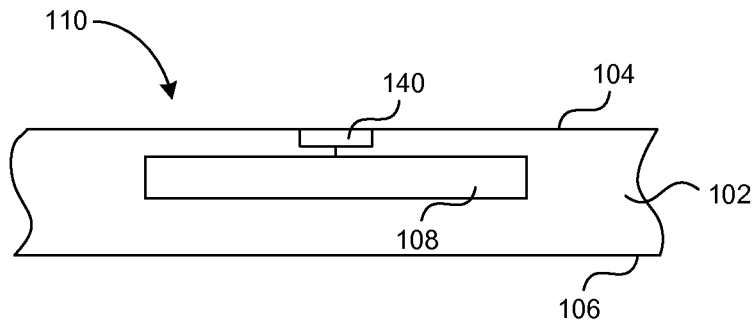
FIGS. 3A-F are schematic cross-sectional views illustrating a number of stages of a method for fabricating semiconductor devices in accordance with an embodiment of the invention.
Figure 3B:
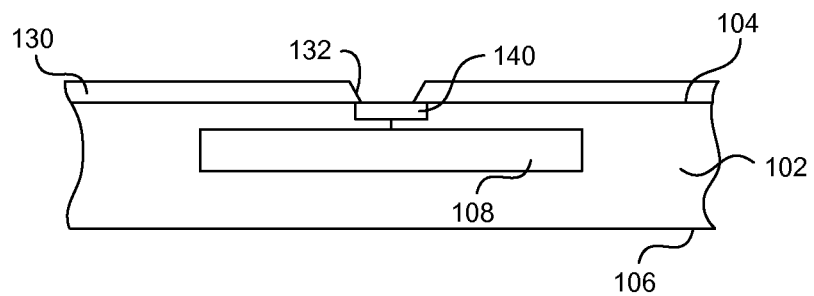

FIGS. 3A-F illustrate sequential stages of an embodiment of a method for forming wirebond sites, such as the embodiments of the wirebond sites 120 illustrated in FIG. 2. Although FIGS. 3A-F illustrate a single wirebond site, in practice a plurality of wirebond sites are constructed across the wafer simultaneously. FIG. 3A, more specifically, is a schematic cross-sectional view at an initial stage in which the copper terminals 140 have been formed at the first side 104 of the substrate 102. The copper terminals 140 can be formed by electrolessly depositing copper onto the substrate 102. FIG. 3B illustrates a subsequent stage in which the dielectric layer 130 has been deposited onto the first side 104 of the substrate 102 and the openings 132 have been formed in the dielectric layer 130. The dielectric layer 130 can be deposited using CVD, spin-on, or other suitable techniques for covering the first surface 104 with the dielectric layer 130. The openings 132 can be formed by patterning and etching the dielectric layer 130. The dielectric layer 130, for example, can be made from a photoimageable material, and the openings 132 can be formed by exposing areas of the dielectric layer to radiation such that the areas of the dielectric layer 130 aligned with the copper terminals 140 have a higher solubility in a developing fluid than the other areas of the dielectric layer 130. The portions of the dielectric layer 130 aligned with the copper terminals 140 are then removed using the developing solution to form the openings 132. The openings 132 accordingly expose at least a portion of the copper terminals 140.

Figure 3C:
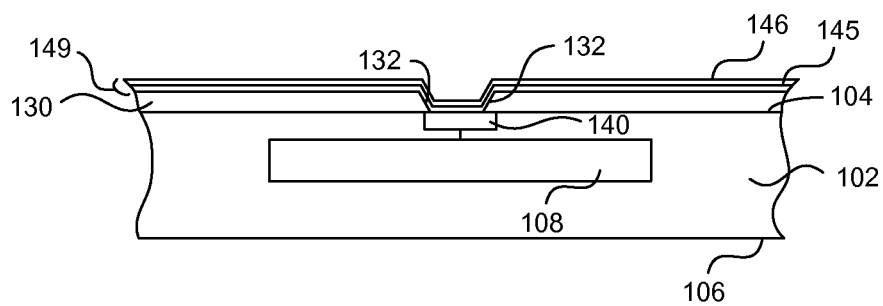
Figure 3D:
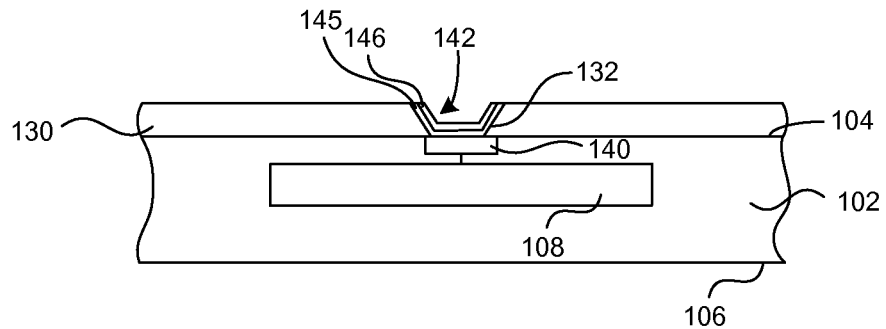

FIGS. 3C and 3D illustrate subsequent stages of forming an embodiment of the adhesion element 142 (FIG. 3D). Referring to FIG. 3C, one embodiment of the adhesion element 142 is formed by (a) depositing a liner 145 onto the dielectric layer 130 and the exposed portions of the copper terminals 140 and (b) depositing a copper deposit 146 onto the liner 145. The liner 145 can be a conductive material that bonds or otherwise adheres to the material of the dielectric layer 130 with an adhesion force greater than the adhesion force between nickel and the dielectric layer 130 without the liner 145. The liner 145, for example, can be tantalum deposited using a physical vapor deposition (PVD) process or other suitable types of vapor deposition processes. The copper deposit 146 can be deposited using PVD processes or other suitable deposition processes. The liner 145 and copper deposit 146 have an overburden portion 149 on top of the dielectric layer 130 in areas outside of the openings 132. FIG. 3D illustrates a subsequent stage after the overburdened portion 149 has been removed to expose the top of the dielectric layer 130. The overburden portion 149 (shown in FIG. 3C) can be removed using chemical-mechanical planarization processes, grinding, or other suitable processes such that discrete portions of the liner 145 and copper deposit 146 remain in the openings 132 and on corresponding copper terminals 140. In this embodiment, individual adhesion elements 142 are defined by the discrete portions of the liner 145 and copper deposit 146 in corresponding openings 132.

Figure 3E:
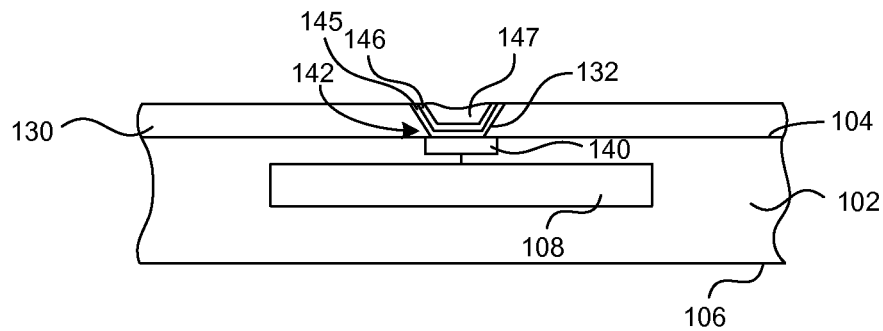
Figure 3F:
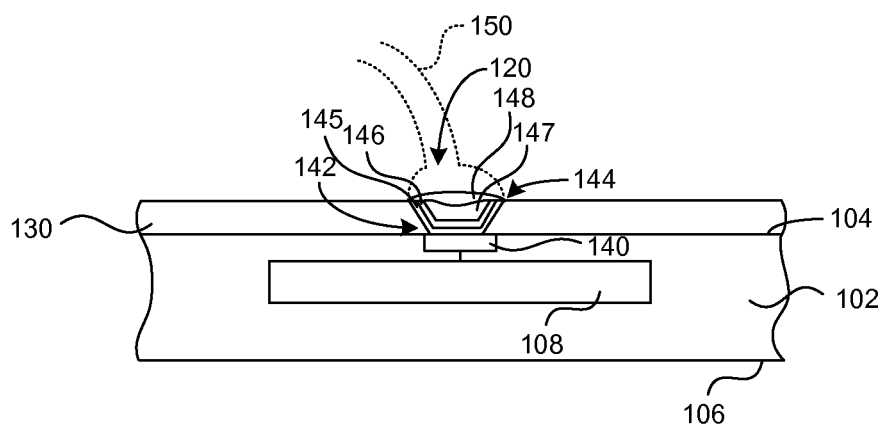

FIGS. 3E and 3F illustrate stages of the method for forming an embodiment of the wirebond elements 144 (FIG. 3F) on the adhesion elements 142. Referring to FIG. 3E, the first stage of forming the wirebond elements includes depositing a nickel layer 147 or other suitable layer onto the copper deposit 146. The nickel layer 147, for example, can be electrolessly plated onto the copper deposit 146 using known techniques. The wirebond element 144 can be completed as shown in FIG. 3F by depositing a wirebond film 148 onto the nickel layer 147. The wirebond film 148 can be deposited using electroless plating processes, flash processes, other suitable immersion processes, or vapor deposition processes. The wirebond film 148, for example, can be gold and/or palladium deposited onto the nickel layer 147 using electroless plating processes. The wirebond site 120 is accordingly completed with the formation of the wirebond film 148. A wirebond 150 (shown in broken lines) can then be attached to the wirebond film 148 using wirebonding tools and techniques.

Figure 4A:
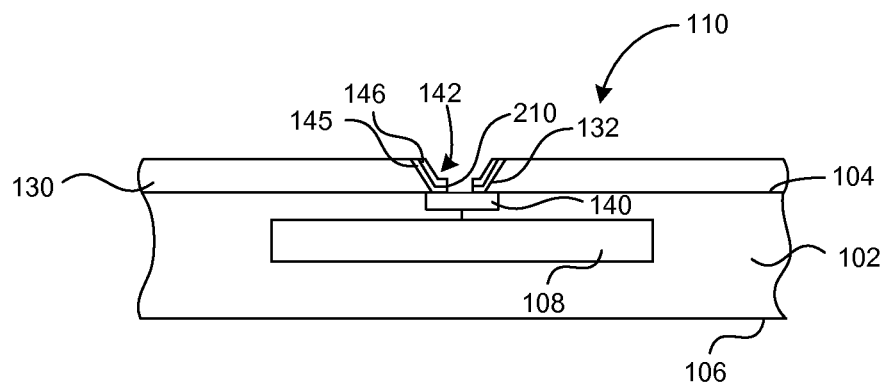
FIGS. 4A-C are schematic cross-sectional views of another method for fabricating semiconductor devices.
Figure 4B:
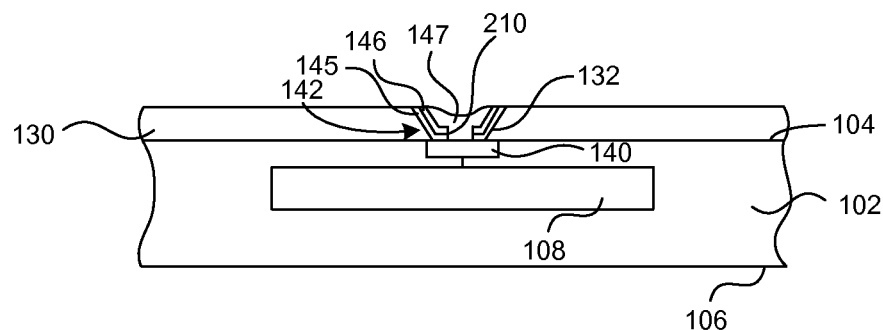
Figure 4C:
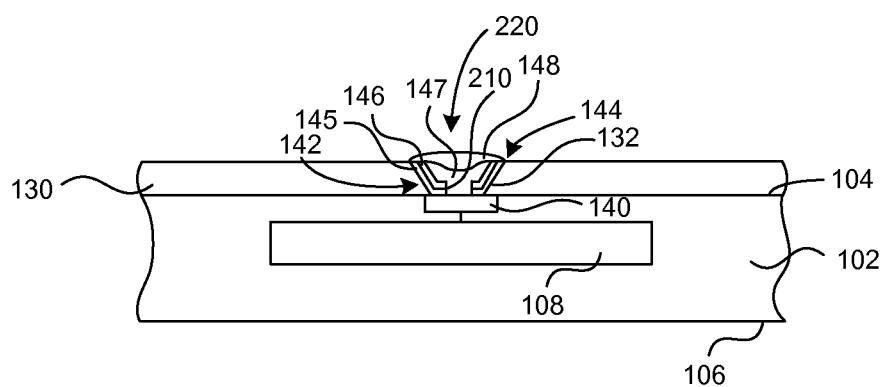

FIGS. 4A-4C illustrate stages of a method for forming a wirebond site 220 (FIG. 4C) in accordance with another embodiment. Referring to FIG. 4A, the die 110 is at a stage similar to the stage illustrated in FIG. 3D, but an aperture 210 is formed in the adhesion element 142. The aperture 210 can be formed by patterning and etching the aperture 210 through the copper deposit 146 and the liner 145. The liner 145 in this embodiment can be a conductive material or a dielectric material because the electrical connection to the copper terminal 140 can be made through the aperture 210. FIG. 4B illustrates forming the wirebond element 144 by depositing the nickel layer 147 into the aperture 210 and onto the copper deposit 146. The nickel layer 147 accordingly directly contacts the copper terminal 140. FIG. 4C illustrates a subsequent stage of forming the wirebond element 144 that includes depositing the wirebond film 148 onto the nickel layer 147 in a manner similar to the stage illustrated in FIG. 3F. The wirebond site 220 may provide many of the same advantages as the wirebond site 120 described above. In other embodiments, the wirebond film 148 can be deposited directly onto the copper deposit 146. The wirebond site 220 may provide a higher conductivity because the nickel layer 147 directly contacts the copper terminal 140. The conductivity of the liner 145, therefore, may not influence the electrical properties of the wirebond site 220 shown in FIG. 4B.

Figure 5A:
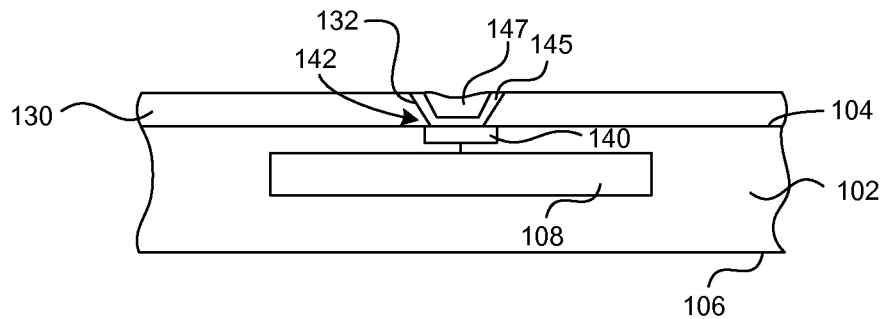
FIGS. 5A and 5B are schematic cross-sectional views of an additional method for fabricating semiconductor devices.
Figure 5B:
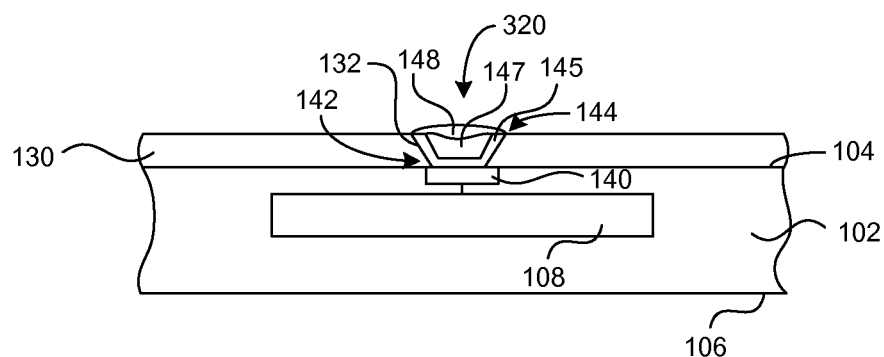

FIGS. 5A and 5B illustrate stages of a method for forming a wirebond site 320 (FIG. 5B) in accordance with another embodiment. The stage illustrated in FIG. 5A is similar to the stage illustrated in FIG. 3D, but the adhesion element 142 in FIGS. 5A and 5B has a single layer. In one embodiment, the adhesion layer 142 has the liner 145, but not the separate copper deposit 146. The liner 145 can be a copper deposit or another material that provides a surface for depositing nickel or other suitable materials for the wirebond element. The liner 145 can be deposited on the dielectric layer 130 and the exposed portions of the copper terminals 140 using vapor deposition processes or other suitable process. The overburdened portion (not shown) of the liner 145 can then be removed using a planarizing process to electrically isolate the liners 145 on corresponding copper terminals 140. The nickel layer 147 can then be electrolessly deposited onto corresponding liners 145 as shown in FIG. 5A. FIG. 5B illustrates a subsequent stage in which the wirebond element 144 is formed by depositing the wirebond film 148 onto the nickel layer 147 as described above. The embodiment of the wirebond site 320 illustrated in FIG. 5B can include different configurations. For example, the single-layer adhesion element 142 may be formed from a material other than copper.

Figure 6:
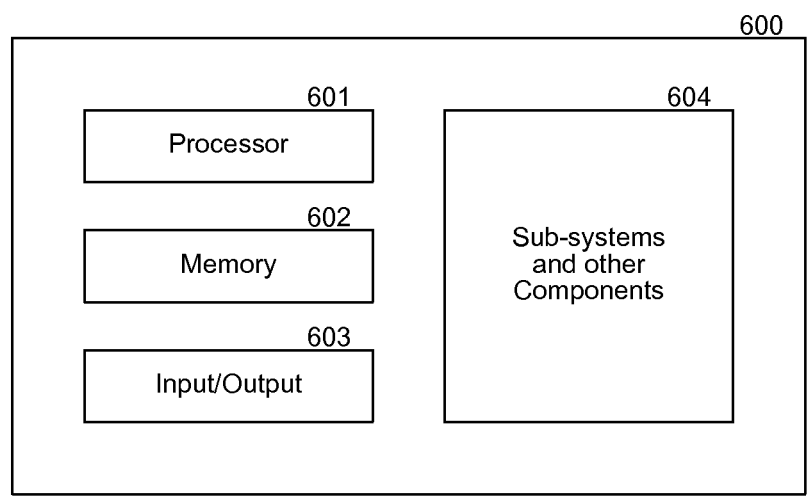
FIG. 6 is a schematic view of a system incorporating one or more semiconductor devices.

Any one of the semiconductor components described above with reference to FIGS. 1-5B can be incorporated into any of a myriad of larger and/or more complex systems, a representative example of which is system 600 shown schematically in FIG. 6. The system 600 can include a processor 601, a memory 602 (e.g., SRAM, DRAM, flash, and/or other memory device), input/output devices 603, and/or other subsystems or components 604. The foregoing semiconductor devices described above with reference to FIGS. 1-5B may be included in any of the components shown in FIG. 6. The resulting system 600 can perform any of a wide variety of computing, processing, storage, sensing, imaging, and/or other functions. Accordingly, representative systems 600 include, without limitation, computers and/or other data processors, for example, desktop computers, laptop computers, Internet appliances, hand-held devices (e.g., palm-top computers, wearable computers, cellular or mobile phones, personal digital assistants, etc.), multiprocessor systems, processor-based or programmable consumer electronics, network computers, and minicomputers. Other representative systems 600 include cameras, light or other radiation sensors, servers and associated server subsystems, display devices, and/or memory devices. In such systems, individual dies can include imager arrays, such as CMOS imagers. Components of the system 600 may be housed in a single unit or distributed over multiple, interconnected units (e.g., through a communications network). The components of the system 600 can accordingly include local and/or remote memory storage devices, and any of a wide variety of computer readable media.

Figure 7:
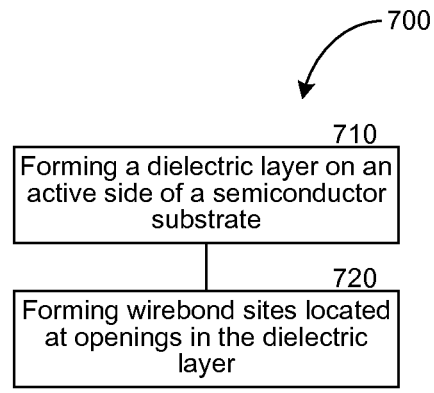
FIGS. 7 and 8 are flow charts of embodiments of methods of fabricating semiconductor devices.

FIG. 7 is a flow chart of a method 700 for fabricating semiconductor devices in accordance with an embodiment. The method 700 can include forming a dielectric layer on an active side of a semiconductor substrate (block 710). The dielectric layer may have openings aligned with corresponding wirebond sites at the active side of the substrate. The method 700 further includes forming a plurality of wirebond sites located at the openings in the dielectric layer (block 720). The wirebond sites are electrically coupled to an integrated circuit in the semiconductor substrate and electrically isolated from each other. The wirebond sites, for example, can be formed by electrolessly depositing nickel into the openings and forming a wirebond film on the nickel without forming a seam between the nickel and the dielectric layer.

Figure 8:
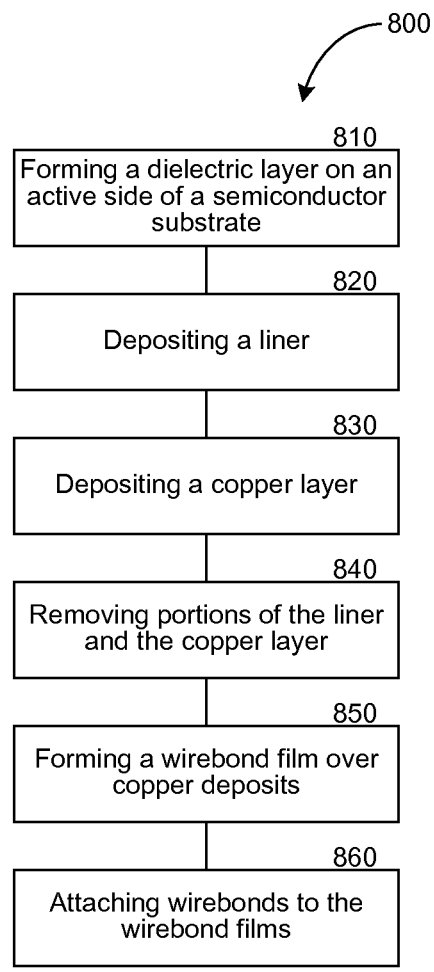

FIG. 8 is a flow chart illustrating a method 800 in accordance with another embodiment. The method 800 can include forming a dielectric layer on an active side of a semiconductor substrate (block 810). The dielectric layer, for example, can have openings aligned with corresponding copper terminals at the active side of the substrate, and the copper terminals can be electrically coupled to an integrated circuit in the substrate. The method 800 further includes depositing a liner on the dielectric layer and the copper terminals (block 820), and depositing a copper layer on the liner (block 830). The method 800 continues by removing portions of the liner and the copper layer until the dielectric layer is exposed in areas between the openings (block 840). The process of removing portions of the liner and the copper layer produces adhesion elements having discrete portions of the liner and copper deposits remaining in individual openings of the dielectric layer. The method 800 also includes forming individual wirebond films over corresponding copper deposits (block 850) and attaching wirebonds to corresponding wirebond films (block 860).

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. It will also be appreciated that specific embodiments of the invention have been described herein for purposes of illustration, but that various modifications may be made without deviating from the inventions. For example, many of the elements of one of embodiment can be combined with other embodiments in addition to, or in lieu of, the elements of the other embodiments. Additionally, other embodiments can deposit a wirebond film or other wirebondable metal directly on an adhesion layer, or a layer of the wirebond elements can be cobalt, a cobalt alloy, or other suitable alloys. Accordingly, the invention is not limited except as by the appended claims.

I claim:

1. A method of fabricating a semiconductor device, comprising:
    forming a dielectric layer on an active side of a semiconductor substrate, wherein the dielectric layer has openings at least partially aligned with corresponding copper terminals at the active side of the substrate, and wherein the copper terminals are electrically coupled to an integrated circuit in the substrate;
    depositing a liner on the dielectric layer and the copper terminals;
    depositing a copper layer on the liner;
    removing portions of the liner and the copper layer until the dielectric layer is exposed in areas between the openings, wherein adhesion elements having discrete portions of the liner and copper deposits remain in individual openings, and wherein the individual adhesion elements each include a depression at least partially extending into the corresponding opening of the dielectric material;
    forming individual nickel deposits on the corresponding adhesion elements, wherein the individual nickel deposits at least substantially fill the depressions in the adhesion elements;
    forming individual wirebond films on corresponding nickel deposits, wherein the individual nickel deposits each have a volume in the depression greater than that of the wirebond film in the depression, and wherein the wirebond films and the nickel deposits define wirebond elements that are electrically isolated from each other; and
    attaching wirebonds to corresponding wirebond films.

2. The method of claim 1 wherein depositing a liner comprises depositing tantalum using chemical vapor deposition, and wherein depositing a copper layer on the liner comprises depositing copper using physical vapor deposition.

3. The method of claim 1 wherein removing portions of the liner and the copper layer comprises rubbing an abrasive medium against the copper layer and the liner until the top portion of the dielectric layer is exposed.

4. The method of claim 1 wherein forming individual wirebond films comprises electrolessly plating one of gold or palladium onto the nickel deposits.

5. A method of fabricating a semiconductor device, comprising:
    forming a dielectric layer on an active side of a semiconductor substrate, wherein the dielectric layer has openings aligned with corresponding wirebond sites at the active side of the substrate; and
    forming a plurality of wirebond sites located at the openings in the dielectric layer, wherein the wirebond sites are electrically coupled to an integrated circuit in the semiconductor substrate and electrically isolated from each other, and wherein forming the individual wirebond sites comprises—
        depositing a conductive liner onto the dielectric layer and into the openings,
        depositing a copper layer onto the liner, wherein the copper layer includes a depression that extends at least partially into the opening of the dielectric layer,
        electrolessly depositing nickel into the depressions such that the nickel at least substantially fills the depressions, and
        forming a wirebond film on the nickel without forming a seam between the nickel and the dielectric layer, wherein there is more nickel than wirebond film in the depression.

6. The method of claim 5 wherein before electrolessly depositing the nickel, the process of forming the wirebond sites further comprises electrically isolating portions of the liner and the copper layer in the openings of the dielectric layer.

7. The method of claim 6 wherein electrically isolating portions of the liner and the copper layer in the openings of the dielectric layer comprises planarizing the device to remove an overburden portion of the liner and copper layer until the dielectric layer is exposed.

8. The method of claim 7 wherein depositing the liner comprises vapor deposition of at least one of tantalum, tantalum nitride, titanium, and titanium nitride, and wherein depositing the copper layer comprises physical vapor deposition of copper.

9. The method of claim 6 wherein depositing the copper layer comprises physical vapor deposition of copper onto the conductive liner.

10. The method of claim 5 wherein forming the wirebond film comprises depositing at least one of gold, silver, palladium and aluminum onto the nickel.

11. The method of claim 10 wherein forming the wirebond film comprises an electroless plating process.

12. A method of fabricating a semiconductor device, comprising:
    forming a dielectric material on an active side of a semiconductor substrate, wherein the dielectric material has openings generally aligned with copper terminals at the active side of the substrate, and wherein the copper terminals are electrically coupled to an integrated circuit in the substrate;
    forming a plurality of adhesion elements in the openings of the dielectric material and electrically coupled to the corresponding copper terminals, wherein the individual adhesion elements include a depression extending at least partially into the corresponding opening in the dielectric material; and
    forming a plurality of wirebond elements on the adhesion elements, wherein the individual wirebond elements include a nickel deposit at least substantially filling the depression in the corresponding adhesion element and a wirebond film on the nickel deposit, wherein at least a portion of the wirebond film is in the depression, and wherein there is more nickel than wirebond film in the depression.

13. The method of claim 12 wherein forming the plurality of adhesion elements comprises:
   forming a conductive liner on the dielectric material and in the openings;
   forming a copper deposit on the conductive liner; and
   electrically isolating portions of the conductive liner and the copper deposit in the openings of the dielectric layer before forming the wirebond elements.

14. The method of claim 12, further comprising forming apertures in the adhesion elements at the copper terminals, and wherein forming the plurality of wirebond elements comprises contacting portions of the individual wirebond elements with the corresponding copper terminals.

15. The method of claim 12 wherein forming the plurality of wirebond elements comprises electrolessly plating nickel to the adhesion elements in the depressions.

16. The method of claim 12 wherein forming the plurality of adhesion elements comprises forming a liner on the dielectric material and in the openings, wherein the liner comprises at least one of one of tantalum, tantalum nitride, titanium, and titanium nitride.

17. The method of claim 12 wherein the wirebond film comprises at least one of gold, silver, palladium, and aluminum.

* * * * *

UNITED STATES PATENT AND TRADEMARK OFFICE
CERTIFICATE OF CORRECTION

| | | |
|---|---|---|
| PATENT NO. | : 8,569,161 B2 | Page 1 of 1 |
| APPLICATION NO. | : 13/103459 | |
| DATED | : October 29, 2013 | |
| INVENTOR(S) | : Joseph T. Lindgren | |

It is certified that error appears in the above-identified patent and that said Letters Patent is hereby corrected as shown below:

In the Claims

In column 9, line 23, in Claim 16, delete "one of one of" and insert -- one of --, therefor.

Signed and Sealed this
Twenty-eighth Day of January, 2014

Michelle K. Lee
*Deputy Director of the United States Patent and Trademark Office*